United States Patent [19]
Ayers et al.

[11] Patent Number: 5,939,897
[45] Date of Patent: Aug. 17, 1999

[54] METHOD AND APPARATUS FOR TESTING QUIESCENT CURRENT IN INTEGRATED CIRCUITS

[75] Inventors: Robert Lee Ayers, Durham; Geoffrey B. Stephens, Cary, both of N.C.

[73] Assignee: International Business Machines Corporation, Armonk, N.Y.

[21] Appl. No.: 09/022,305

[22] Filed: Feb. 11, 1998

Related U.S. Application Data

[62] Division of application No. 08/599,900, Feb. 12, 1996, Pat. No. 5,760,598.

[51] Int. Cl.⁶ ...................... H03K 19/0948; H03K 19/00
[52] U.S. Cl. ................................ 326/58; 326/16; 326/121
[58] Field of Search .............................. 371/22.1; 326/16, 326/112, 119, 121, 57, 58, 87

[56] References Cited

U.S. PATENT DOCUMENTS 5,329,175   7/1994   Peterson ................................... 307/443

*Primary Examiner*—Jon Santamauro
*Attorney, Agent, or Firm*—Steven B. Phillips

[57] ABSTRACT

A method and apparatus for obtaining near 100 percent quiescent current test coverage within a reasonable amount of time is accomplished by providing a plurality of test circuits interdisposed between a plurality of combinational logic circuits. During testing, the testing circuits isolate the input of one combinational logic circuit from the output of the preceding combinational logic, thus allowing the test circuit to stimulate the input of the combinational logic circuit. By performing the input stimulations of the plurality of combinational logic circuits simultaneously, only two test steps are needed to check the quiescent current of the plurality of combinational logic circuits.

4 Claims, 4 Drawing Sheets

| TEST CONDITIONS | | |
|---|---|---|
| T.L. 26 | T.L. 28 | CONDITION |
| 0 | 0 | PULL-UP |
| 0 | 1 | NORMAL |
| 1 | 0 | INVALID |
| 1 | 1 | PULL-DOWN |

METHOD AND APPARATUS FOR TESTING QUIESCENT CURRENT IN INTEGRATED CIRCUITS

CROSS REFERENCE TO RELATED APPLICATION

This application is a division of application SN 08/599,900, filed Feb. 12, 1996 and issued as U.S. Pat. No. 5,760,598.

TECHNICAL FIELD OF THE INVENTION

This invention relates generally to the field of integrated circuits and, more specifically, to testing quiescent current of CMOS integrated circuits.

BACKGROUND OF THE INVENTION

As is known, integrated circuits (IC) consist of a plurality of interoperable circuits fabricated on a silicon substrate. The number of interoperable circuits that can be supported by a substrate continues to grow as the art of IC manufacturing advances. Currently, it is not uncommon for an IC to include several million transistors which are configured into tens of thousands of interoperable circuits.

While increasing the number of circuits that can be fabricated on a single IC allows IC users to design smaller and faster products, it presents the IC manufacturer with increased challenges of effectively manufacturing the ICs. One such challenge is how to test newly produced ICs accurately and efficiently.

To facilitate IC testing, most ICs include test circuitry which may account for 17 percent to 30 percent of the circuitry on the IC. Testing is usually done to insure proper logical operations of the circuits and to detect manufacturing defects. To insure proper logical operation, the IC, while in a test mode, is stimulated using known test patterns and monitoring the output response. If the resulting response is as anticipated, it is assumed that the IC is functioning properly. As one can readily appreciate, for VLSI (very large-scale integration) ICs, tens to hundreds of megabytes of test patterns are needed to test most of the IC.

To test for manufacturing defects in CMOS circuits, quiescent current is measured. As is known, a static CMOS circuit conducts only leakage current (quiescent current). If the quiescent current is too high, it indicates that at least one transistor in the circuit has a gate oxide problem or some other leakage problem. In order to detect all possible locations for gate oxide defects, it would be necessary to apply all the combinations of stimuli to toggle every logic gate while measuring the quiescent current. Typically, it takes 100 to 200 milliseconds per measurement; thus, to get close to 100 percent test coverage of a VLSI chip, it would take hundreds of hours. This is unacceptable to an IC manufacturer who requires ICs to be tested in less than ten seconds.

IC manufacturers, thus, have had to compromise between 100 percent testing and testing time. One such compromise solution is to inject a set of scan chains into the IC, stop the stimulus, and measure the quiescent current. To meet the time constraints, the injection of a scan chain can only be stopped about 30 times, which yields a 60 to 80 percent test coverage.

Therefore, a need exists for a method and apparatus that allows for near 100 percent testing coverage of quiescent current in a short period of time.

DETAILED DESCRIPTION OF A PREFERRED EMBODIMENT

Generally, the present invention provides a method and apparatus for obtaining near 100 percent quiescent current test coverage within a reasonable amount of time. This may be accomplished by providing a plurality of test circuits interdisposed between a plurality of combinational logic circuits. During testing, the testing circuits isolate the input of one combinational logic circuit from the output of the preceding combinational logic, thus allowing the test circuit to stimulate the input of the combinational logic circuit. By performing the input stimulations of the plurality of combinational logic circuits simultaneously, only two test steps are needed to check the quiescent current of the plurality of combinational logic circuits. Thus, by only requiring two test steps to require the quiescent current of the plurality of combinational logic circuits, near 100 percent quiescent current test coverage can be obtained within a minimal amount of time.

Figure 1:
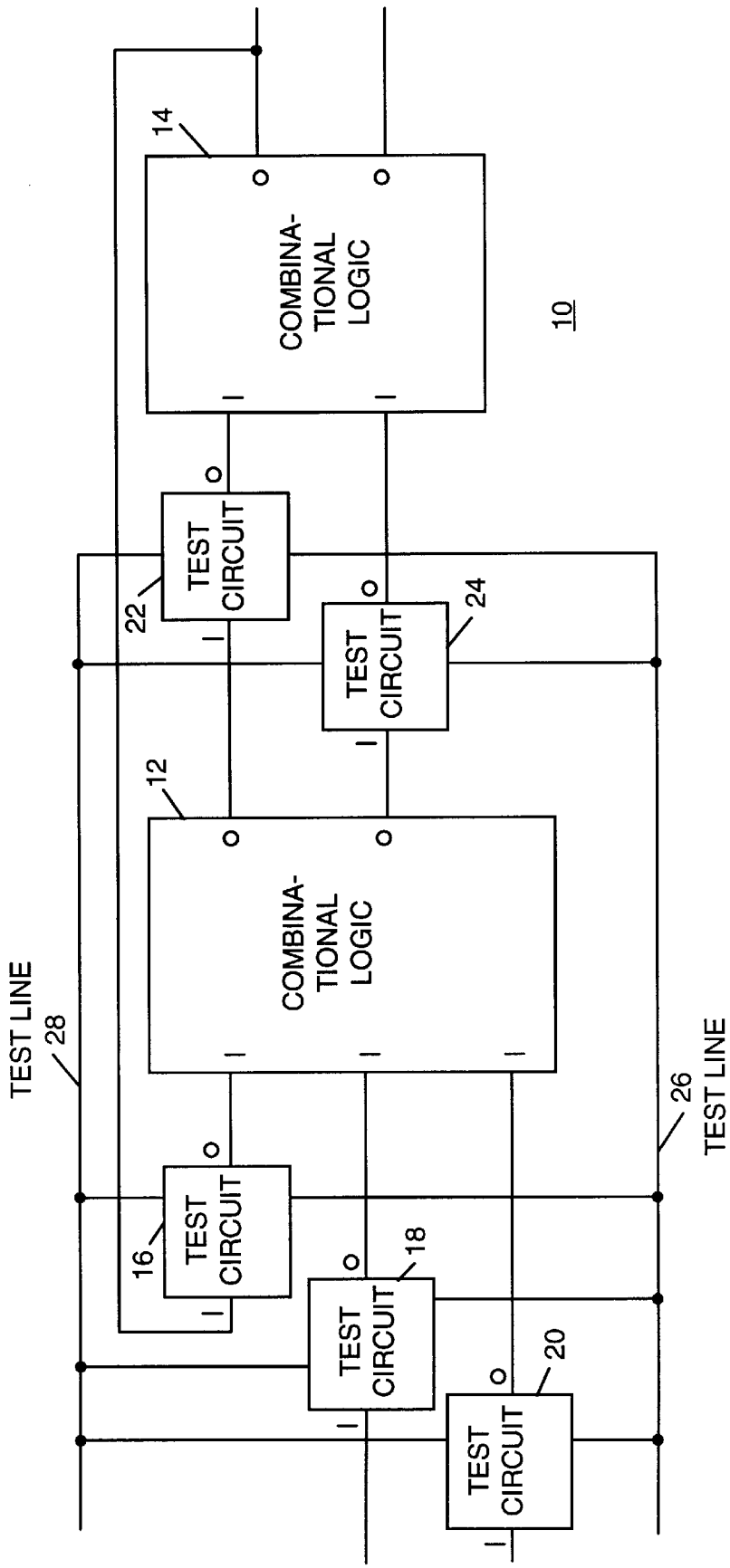
FIG. 1 illustrates a schematic block diagram of an integrated circuit that incorporates the teachings of the present invention.

FIG. 1 illustrates an integrated circuit 10 that comprises a plurality of combinational logic circuits 12, 14, and a plurality of test circuits 16, 18, 20, 22, 24. In addition, the integrated circuit includes a pair of test lines 26 and 28 that are operably coupled to each of the plurality of test circuits. As shown, the output of each test circuit 16, 18, 20, 22, 24 is operably coupled to an input of one of the combinational logic circuits. The inputs of test circuits 16, 22, 24 are provided by the output of one of the combinational logic circuits. The input for test circuit 18 and test circuit 20 are provided from pins of the integrated circuit or other test vehicles within the integrated circuit. Thus, as shown, each of the outputs of the test circuit are coupled to an input of one of the combinational logic circuits 12, 14 while the inputs of the test circuits 16, 18, 20, 22, 24 may be provided by an output of one of the combinational logic circuits 12, 14, test circuitry within the integrated circuit 10, or via input pins of the integrated circuit. The combinational logic circuits 12, 14 may be comprised of any type of logic circuits. For example, the combinational logic circuits 12, 14 may be as simple as an AND gate, NAND gate, NOR gate, etc., may be as complex as a memory block, arithmetic unit, central processing unit, or may be anywhere in the range of the simple logic circuit to the complex logic circuit.

Figure 2:
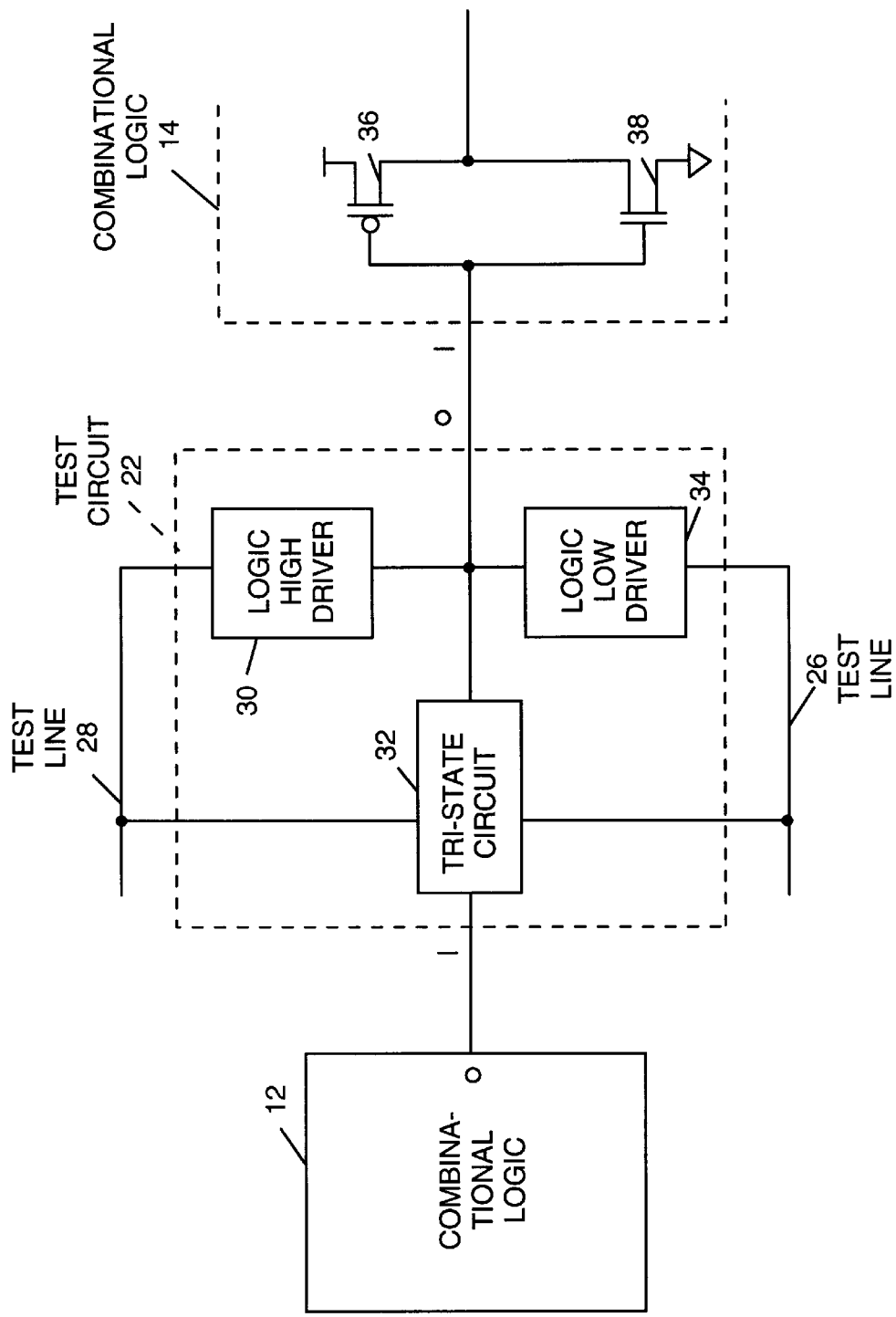
FIG. 2 illustrates a test circuit and combinational logic circuit of FIG. 1 in greater detail.

FIG. 2 illustrates a more detailed schematic block diagram of test circuit 22 coupled to the combinational logic circuits 12 and 14. As shown, the test circuit 22 includes a logic high driver 30, a tri-state circuit 32, and a logic low driver 34. In test mode, test line 28 may activate the logic high driver and the tri-state circuit 32. In this mode, the tri-state circuit will decouple the output of combinational logic circuit 12 from the input of combinational logic circuit 14 and simultaneously provide a logic 1 signal from the logic high driver 30 to the input of the combinational logic circuit 14.

In this test mode, with the logic high driver 30 providing a logic 1 signal to the input of combinational logic circuit 14, the P-channel transistor 36 will be off while the N-channel field effect transistors 38 will be on. In this state, the quiescent current of transistor 38 can be measured. Note that the input of the combinational logic circuit 14 is shown to include a P-channel transistor 36 and an N-channel transistor 38. As one skilled in the art will readily appreciate, the input circuit to the combinational logic circuit may be any form of logic input circuit such as the input to a NAND gate, NOR gate, etc.

During a second testing operation, test line 26 activates the logic low driver 34 and the tri-state circuit 32. In this testing mode, the output of combinational logic 12 is again isolated from the input of the combinational logic circuit 14 while the logic low driver 34 provides a logic low signal to the input of the combinational logic circuit 14. In this state, the P-channel transistor 36 is turned on while the N-channel transistor 38 is inactivated. In this state, the quiescent current of the P-channel 36 can be measured. Note that with the test circuit 22 as shown, the effects of the quiescent current of the P-channel transistor and the quiescent current of the N-channel transistor can be measured independently without influence from the output circuits of the combinational logic circuit 12.

Figure 3:
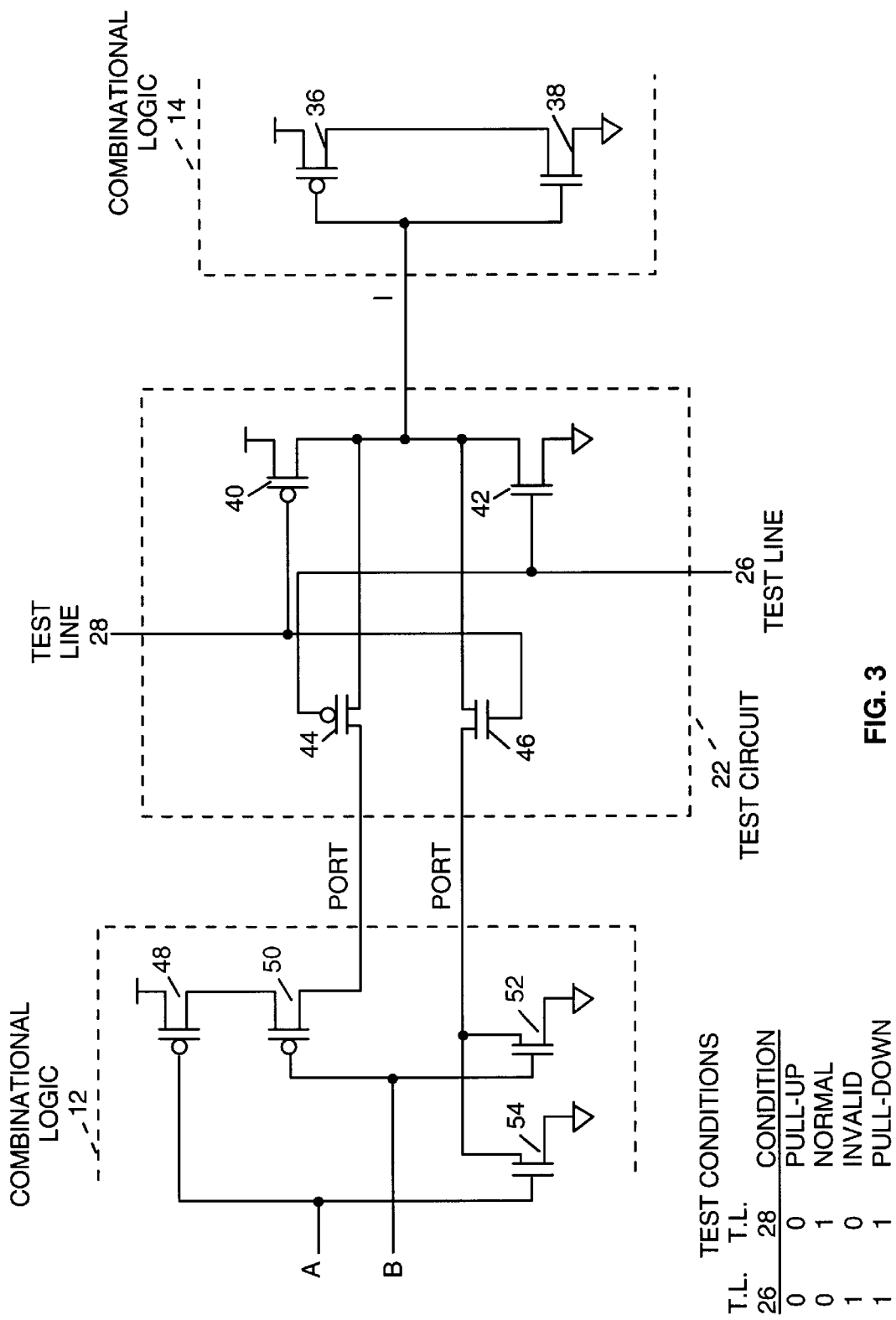
FIG. 3 illustrates an alternate, more detailed depiction of a test circuit and combinational logic circuits of FIG. 1.

FIG. 3 illustrates a more detailed schematic representation of the test circuit 22 coupled to the combinational logic circuits 12, 14. As shown, the test circuit 22 includes a P-channel transistor 40, an N-channel transistor 42, a second P-channel transistor 44, and a second N-channel transistor 46. The P-channel transistor 44 is coupled to one output port of the combinational logic circuit 12 while the second N-channel transistor 46 is coupled to a second output port of combinational logic circuit 12.

Combinational logic circuit 12 is shown as a NOR gate comprising P-channel transistors 48, 50 and N-channel transistors 52, 54. As shown, the nodal connection between the P-channel transistors 48, 50 and the N-channel transistors 52, 54 is provided through the test circuit 22. When either the P-channel transistor 44 or the N-channel transistor 46 is inoperable, the P-channel transistors 48, 50 are isolated, or decoupled, from the N-channel transistors 52, 54. In contrast, when both P-channel transistor 44 and N-channel transistor 46 are activated, the P-channel transistors 48, 50 are coupled to the N-channel transistors 52, 54.

To test the pull-up function, as shown in the test conditions table, the test lines 26 and 28 are both provided with a logic low signal. In this state, transistor 42 is off while transistor 40 is activated. This allows a logic 1 signal to be provided to the input of the combinational logic circuit 14. In addition, while both test line circuits are supporting a logic low signal, the N-channel transistor 46 is inactive, thus decoupling the P-channels 48, 50 from the N-channels 52, 54 of combinational logic circuit 12. The other test condition is achieved when both test lines have a logic 1 signal applied thereto. In this condition, transistor 42 is activated while transistor 40 is deactivated. This provides a logic low signal to the input of the combinational logic 14, thus allowing the quiescent current of transistor 36 to be tested. In addition, with both test lines being driven by a logic high signal, the P-channel transistor 44 is inactive, thus decoupling transistors 48, 50 from transistors 52, 54 of the combinational logic circuit 12.

After the testing has been complete, the normal operating condition is achieved when a logic 0 is placed on test line 26 and a logic 1 is placed on test line 28. In this condition, the transistors 40 and 42 are held inactive (i.e., off) while transistors 44 and 46 are held in the active state. Thus, in the normal mode, the test circuit appears as if it were nonexistent, coupling the P-channel transistors 48, 50 to the N-channel transistors 52, 54, and while simultaneously connecting this nodal point to the input of combinational logic circuit 14.

As one can readily appreciate, utilizing the test circuits as shown in FIGS. 1–3, the combinational logic circuits within an integrated circuit can be tested simultaneously using two input test conditions. As one skilled in the art will also readily appreciate, a VLSI integrated circuit may require in the range of 50,000 to 100,000 test circuits to insure near 100 percent testing of the combinational logic circuits present in the integrated circuit.

Figure 4:
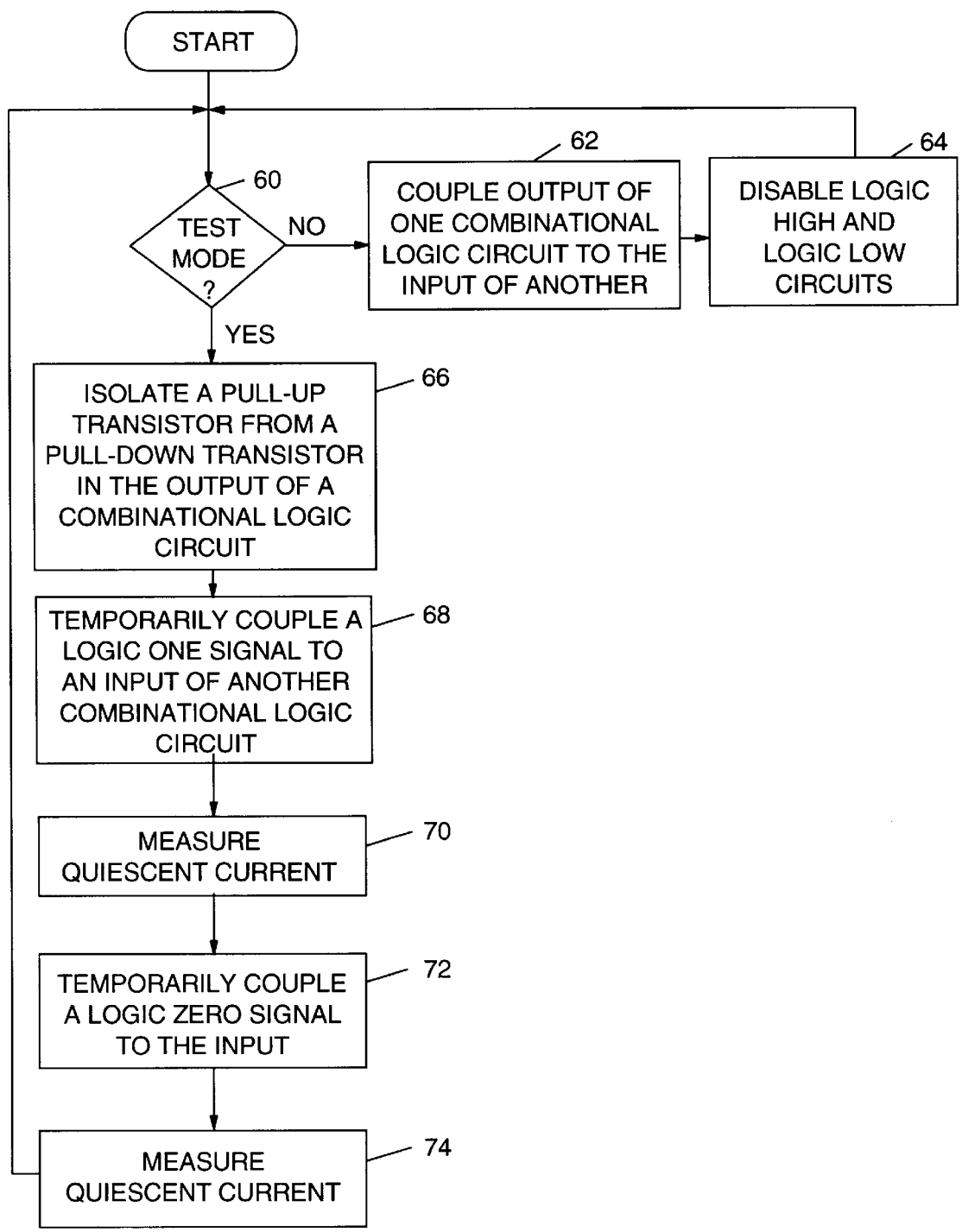
FIG. 4 illustrates a logic diagram that may be used to implement the present invention.

FIG. 4 illustrates a logic diagram which may be used to implement the present invention. The steps represented in FIG. 4 may be implemented using programming instructions that may be stored on a computer readable storage medium such as RAM, ROM, disk, CD-ROM, magnetic tape, etc. The process begins at step 60 where a determination is made as to whether the integrated circuit is in a test mode. If the integrated circuit is not in the test mode, i.e., it is in normal operating mode, the process proceeds to step 62 wherein the output of one combinational logic circuit is coupled to the input of another. Having done this, the process proceeds to step 64 wherein the logic high and logic low circuits of the test circuits are disabled. The test circuit will remain in this operating state as long as the integrated circuit is in normal operating mode.

When the integrated circuit is in the test mode condition, the process proceeds to step 66. At step 66, a pull-up transistor in the output of a combinational logic circuit is isolated from a pull-down transistor in the same combinational logic circuit. Once this is done, the process proceeds to step 68 wherein a logic 1 signal is temporarily coupled to an input of another combinational logic circuit. While the logic 1 signal is temporarily coupled, the process proceeds to step 70 wherein the quiescent current of the input of the combinational logic circuit is measured. Once this measurement is made, the process proceeds to step 72 wherein a logic 0 signal is temporarily coupled to the input of the combinational logic circuit. Having done this, the quiescent current of the input of the combinational logic circuit is again measured. While not shown in FIG. 4, if the quiescent current exceeds a predetermined current threshold, it is indicated that a quiescent current problem exists. As previously mentioned, when an excessive quiescent current is detected, it is indicative that there is a gate oxide problem or defect.

The present invention provides a method and apparatus for obtaining near 100 percent quiescent current test coverage in a reasonable amount of time (i.e., less than a few seconds), thus providing IC manufacturers with a convenient and efficient way of testing quiescent current without the burdens of prior art testing implementations.

What is claimed is:

1. A combinational logic circuit for implementation on an integrated circuit, the combinational logic circuit comprises:
   an output logic section that includes:
      a first N-channel field effect transistor (FET), wherein a source of the first N-channel FET is operably coupled to a supply return;
      a first P-channel FET, wherein a source of the first P-channel FET is operably coupled to a supply line;
   a test circuit that includes:
      a tri-state circuit operably coupled to a drain of the first N-channel FET and a drain of the first P-channel FET, wherein the tri-state circuit is operable to isolate the first N-channel FET and the first P-channel FET during testing and to couple together the drain of the first N-channel FET and the drain of the first P-channel FET during normal operation;

a logic high driver operably coupled to the tri-state circuit for providing, during the testing, a logic one when the first N-channel FET is isolated by the tri-state circuit; and a logic low driver operably coupled to the tri-state circuit for providing, during the testing, a logic zero when the P-channel FET is isolated by the tri-state circuit, wherein activation of the logic low driver is mutually exclusive to activation of the logic high driver.

2. The combinational logic circuit of claim 1 wherein the logic high driver further functions to be inoperative when the N-channel FET is coupled to the P-channel FET by the tri-state circuit.

3. The combinational logic circuit of claim 1, wherein the logic low driver further functions to be inoperative when the N-channel FET is coupled to the P-channel FET by the tri-state circuit.

4. A test interface circuit to be coupled between an output of a first combinational logic circuit and an input of a second combinational logic circuit, the test interface circuit comprising:

a first P-channel field effect transistor (FET) having a drain coupled to a first port of the output of the first combinational logic circuit;

a first N-channel FET having a drain coupled to a second port of the output of the first combination logic circuit and having a source coupled to a source of the first P-channel FET to produce a coupling node;

a second P-channel FET having a source coupled to a supply line and having a drain coupled to the coupling node;

a second N-channel FET having a source coupled to a return line and having a drain coupled to the coupling node;

a first test line coupled to a gate of the first P-channel FET and to a gate of the second N-channel FET; and a second test line, independently operable from said first test line, coupled to a gate of the second P-channel FET and to a gate of the first N-channel FET.

* * * * *